United States Patent
Inano et al.

(10) Patent No.: US 10,912,222 B2
(45) Date of Patent: Feb. 2, 2021

(54) COOLING SYSTEM, COOLING DEVICE, AND ELECTRONIC SYSTEM

(71) Applicant: FUJITSU LIMITED, Kawasaki (JP)

(72) Inventors: Satoshi Inano, Minoh (JP); Hiroyuki Fukuda, Yokohama (JP); Minoru Ishinabe, Atsugi (JP); Yukiko Wakino, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 14 days.

(21) Appl. No.: 16/559,688

(22) Filed: Sep. 4, 2019

(65) Prior Publication Data
US 2019/0394900 A1 Dec. 26, 2019

Related U.S. Application Data

(63) Continuation of application No. PCT/JP2018/008624, filed on Mar. 6, 2018.

(30) Foreign Application Priority Data

Apr. 5, 2017 (JP) .................................. 2017-074947

(51) Int. Cl.
*H05K 7/20* (2006.01)

(52) U.S. Cl.
CPC ..... *H05K 7/20236* (2013.01); *H05K 7/20272* (2013.01)

(58) Field of Classification Search
CPC ..... H01L 23/473; H01L 23/345; H01L 23/44; H05K 7/20236; H05K 7/203;
(Continued)

(56) References Cited

U.S. PATENT DOCUMENTS 3,512,582 A * 5/1970 Chu ....................... H01L 23/427
165/104.27
3,858,090 A * 12/1974 Lehmann ........... H05K 7/20236
361/699
(Continued)

FOREIGN PATENT DOCUMENTS

JP S64-002397 A 1/1989
JP H02-148891 A 6/1990
(Continued)

OTHER PUBLICATIONS

International Search Report and Written Opinion of the International Searching Authority (Form PCT/ISA/210 and 237), mailed in connection with PCT/JP2018/008624 and dated May 22, 2018 (10 pages).

*Primary Examiner* — Binh B Tran
*Assistant Examiner* — Michael A Matey
(74) *Attorney, Agent, or Firm* — Fujitsu Patent Center

(57) ABSTRACT

A cooling system includes: a cooling device; a pump coupled to the cooling device; and a waste heat device coupled to the cooling device, wherein the cooling device includes: a first refrigerant tank and a second refrigerant tank that each stores a first refrigerant that is output from the waste heat device and input to the waste heat device; and a liquid immersion tank sandwiched between the first refrigerant tank and the second refrigerant tank and configured to hold an electronic device in a second refrigerant that is output from the pump and input to the pump.

9 Claims, 12 Drawing Sheets

(58) Field of Classification Search
CPC .......... H05K 7/20772; H05K 7/20272; H05K 7/20327; H05K 7/20809; H05K 7/20781; H05K 7/20818; H05K 5/0247; H05K 7/20263; H05K 7/20281; H05K 7/2079; H05K 7/20; G06F 1/20; G06F 2200/201; G06F 1/206; F28D 15/0233; F28D 15/043; F28D 1/0213; F28D 1/05383; F28D 2021/0028; F28F 2250/08

See application file for complete search history.

(56) References Cited

U.S. PATENT DOCUMENTS

| | | | |
|---|---|---|---|
| 4,694,378 A | 9/1987 | Nakayama et al. | |
| 4,704,658 A * | 11/1987 | Yokouchi | H05K 7/203 165/104.33 |
| 4,928,206 A * | 5/1990 | Porter | H05K 1/189 165/104.33 |
| 4,970,868 A * | 11/1990 | Grebe | H01L 23/427 257/E23.088 |
| 5,349,499 A * | 9/1994 | Yamada | H01L 23/427 361/700 |
| 9,332,674 B2 * | 5/2016 | Campbell | H05K 7/20236 |
| 9,989,271 B1 * | 6/2018 | Becker | F24F 5/0021 |
| 10,527,365 B1 * | 1/2020 | Schlottig | F28F 9/0258 |
| 2007/0289721 A1 * | 12/2007 | Miyagawa | F28D 15/0266 165/104.21 |
| 2011/0132579 A1 * | 6/2011 | Best | H05K 7/20772 165/104.31 |
| 2012/0057302 A1 * | 3/2012 | Wei | H05K 7/20781 361/699 |
| 2012/0147553 A1 * | 6/2012 | Eriksen | H05K 7/20272 361/679.53 |
| 2013/0105122 A1 * | 5/2013 | Campbell | F28D 15/0266 165/104.26 |
| 2014/0146468 A1 * | 5/2014 | Campbell | G06F 1/20 361/679.53 |
| 2015/0000319 A1 * | 1/2015 | Smith | H05K 7/20236 62/260 |
| 2015/0109735 A1 * | 4/2015 | Campbell | H05K 7/20318 361/700 |
| 2015/0181762 A1 | 6/2015 | Boyd et al. | |
| 2016/0136749 A1 * | 5/2016 | Lee | B23K 37/003 219/130.1 |
| 2016/0330873 A1 * | 11/2016 | Farshchian | G06F 1/20 |
| 2017/0265336 A1 * | 9/2017 | Ichinose | G06F 1/20 |
| 2017/0303442 A1 * | 10/2017 | Smith | H05K 7/20809 |
| 2017/0303443 A1 * | 10/2017 | Inano | G06F 1/206 |
| 2017/0354061 A1 * | 12/2017 | Saito | G06F 1/20 |
| 2018/0027695 A1 * | 1/2018 | Wakino | H05K 7/20772 361/699 |
| 2018/0084671 A1 * | 3/2018 | Matsumoto | H05K 7/20772 |
| 2018/0092243 A1 * | 3/2018 | Saito | H01L 23/473 |
| 2018/0153058 A1 * | 5/2018 | Hirai | H05K 7/20781 |
| 2018/0343770 A1 * | 11/2018 | Brink | H05K 7/20245 |
| 2019/0239390 A1 * | 8/2019 | Goode | H05K 7/20281 |
| 2019/0364699 A1 * | 11/2019 | Gao | G01M 3/40 |
| 2020/0015383 A1 * | 1/2020 | Gao | H05K 7/20236 |
| 2020/0275579 A1 * | 8/2020 | Gao | H05K 7/1487 |
| 2020/0288601 A1 * | 9/2020 | Gao | H05K 7/20236 |
| 2020/0352058 A1 * | 11/2020 | Zhong | H05K 7/20781 |

FOREIGN PATENT DOCUMENTS

| | | |
|---|---|---|
| JP | H02-214147 A | 8/1990 |
| JP | H05-243771 A | 9/1993 |
| JP | 2008-025858 A | 2/2008 |
| JP | 2016-509278 A | 3/2016 |
| WO | 2014/083810 A1 | 6/2014 |

* cited by examiner

FIG. 7A
FIG. 7B
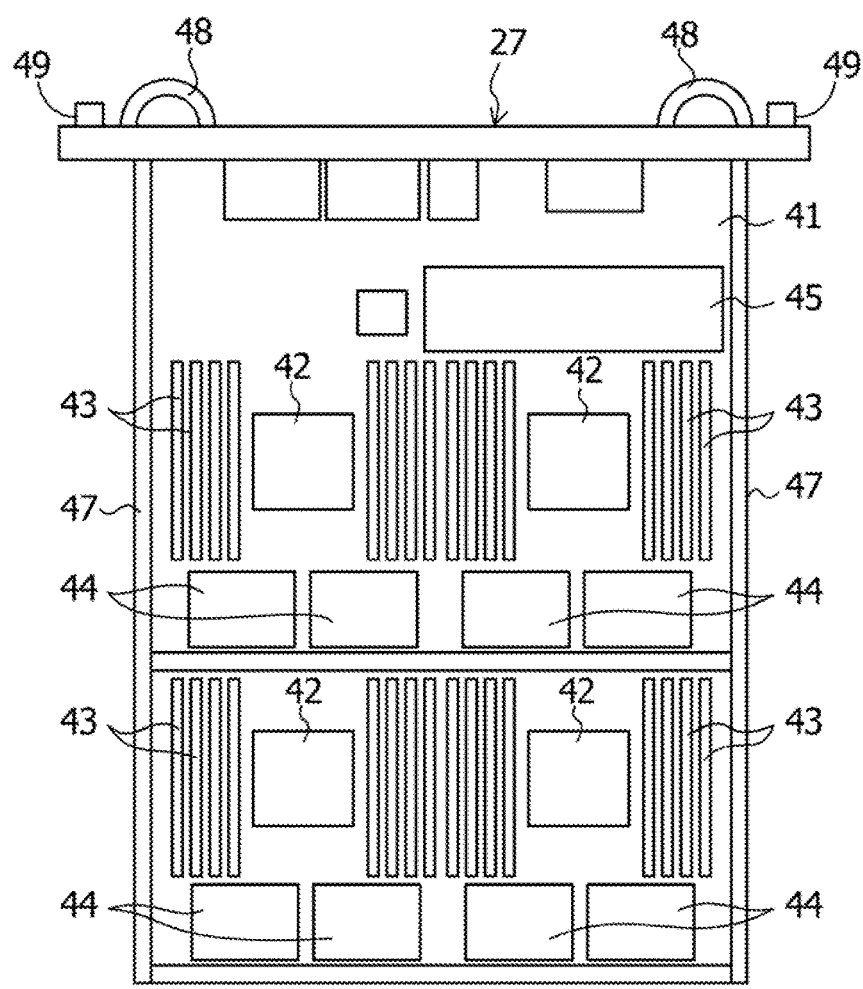
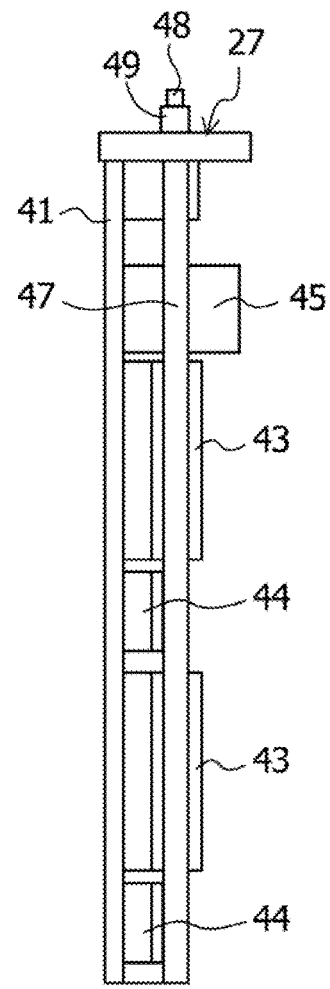

COOLING SYSTEM, COOLING DEVICE, AND ELECTRONIC SYSTEM

CROSS-REFERENCE TO RELATED APPLICATION

This application is a continuation application of International Application PCT/JP2018/008624 filed on Mar. 6, 2018 and designated the U.S., the entire contents of which are incorporated herein by reference. The International Application PCT/JP2018/008624 is based upon and claims the benefit of priority of the prior Japanese Patent Application No. 2017-074947, filed on Apr. 5, 2017, the entire contents of which are incorporated herein by reference.

FIELD

The embodiments discussed herein are related to a cooling system, a cooling device, and an electronic system.

BACKGROUND

In recent years, with the advent of the advanced information society, the importance of electronic devices using information and Communication Technology (ICT) has been increasing more and more. For example, in a data center, a large number of racks are installed indoors, a plurality of electronic devices such as servers and storage devices each are stored in each rack, and these electronic devices are collectively managed.

Japanese Laid-open Patent Publication No. 64-2397 and Japanese National Publication of International Patent Application No. 2016-509278 are disclosed as related art.

SUMMARY

According to an aspect of the embodiments, a cooling system includes: a cooling device; a pump coupled to the cooling device; and a waste heat device coupled to the cooling device, wherein the cooling device includes: a first refrigerant tank and a second refrigerant tank that each stores a first refrigerant that is output from the waste heat device and input to the waste heat device; and a liquid immersion tank sandwiched between the first refrigerant tank and the second refrigerant tank and configured to hold an electronic device in a second refrigerant that is output from the pump and input to the pump.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 5A and 58 are views obtained by removing a flow path of the cooling water from FIGS. 4A and 4B;

FIG. 7A is a plan view of an electronic device, and FIG. 7B is a side view of the electronic device;

DESCRIPTION OF EMBODIMENTS

Figure 1:
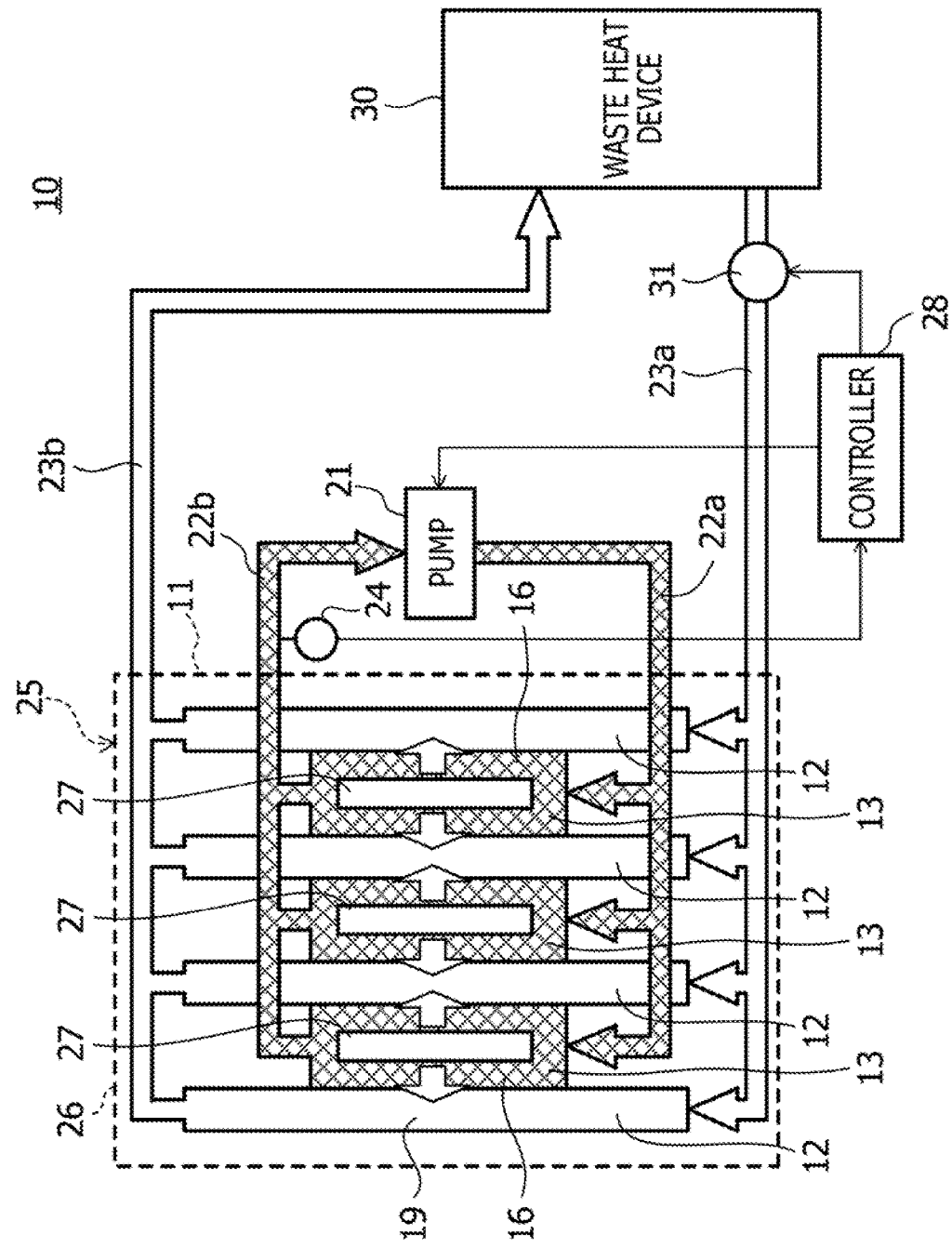
FIG. 1 is a schematic view illustrating an overview of a cooling system according to a first embodiment.

The amount of heat generated by an electronic device is increasing with the improvement of the performance of the electronic device. When electronic devices generating a large amount of heat are mounted at a high density, an electronic device sucks high-temperature air exhausted by other electronic devices repeatedly, so that the temperature of the electronic device exceeds the allowable upper limit temperature, causing malfunction, failure, or deterioration of processing capability. Therefore, there is a need for a cooling method capable of sufficiently cooling electronic devices even when the electronic devices generating a large amount of heat are mounted at a high density.

As one of such cooling methods, it has been proposed to immerse an electronic device in a liquid refrigerant to cool the electronic device. Hereinafter, this type of cooling method is referred to as a liquid immersion cooling method. In the liquid immersion cooling method, an insulation inert refrigerant (for example, a fluorine compound, oil, or the like) is placed in a liquid immersion tank, the electronic device is immersed in the refrigerant, the heat generated by the electronic device is transported to an outdoor waste heat device (chiller, cooling tower, or the like) through the refrigerant, and then is dissipated from the waste heat device to the atmosphere. Hereinafter, the insulation inert refrigerant is simply referred to as "inert refrigerant".

A proposed cooling method may be provided in which a substrate on which electronic components are mounted and a cooling plate are immersed in a liquid immersion tank containing a primary refrigerant to transmit the heat generated by the substrate to a secondary refrigerant through the primary refrigerant and the cooling plate, and then transport the heat to a waste heat device. In addition, a proposed cooling system may be provided in which a heat exchanger is attached to the outer surface of a liquid immersion tank containing a primary refrigerant, and the heat generated by an electronic device in the liquid immersion tank is transported to a waste heat device through the primary refrigerant, the heat exchanger, and a secondary refrigerant.

As described above, in the liquid immersion cooling method, the heat generated by the electronic device is transported to the outdoor waste heat device and dissipated to the atmosphere. However, since the installation place (indoor) of the electronic device and the installation place (outdoor) of the waste heat device are separated, the usage of inert refrigerant increases when the inert refrigerant is circulated between the liquid immersion tank and the waste heat device. Since the inert refrigerant is more expensive than a normal refrigerant, increase of the usage of inert refrigerant increases the cost of construction and operation of the system.

It is conceivable, for example, to install a heat exchanger near the liquid immersion tank to exchange heat between the primary refrigerant (inert refrigerant) and the secondary refrigerant (for example, water), and transport the heat to the waste heat device through the secondary refrigerant, so as to reduce the usage of inert refrigerant. However, in this case, a heat exchanger and a pump are required, and a place for installing them is also required, which causes a problem of high equipment cost.

A cooling system, a cooling device, and an electronic system requiring less usage of an inert refrigerant than that of the conventional technique and also capable of reducing equipment cost may be provided.

Hereinafter, embodiments will be described with reference to the drawings.

First Embodiment

Figure 2A:
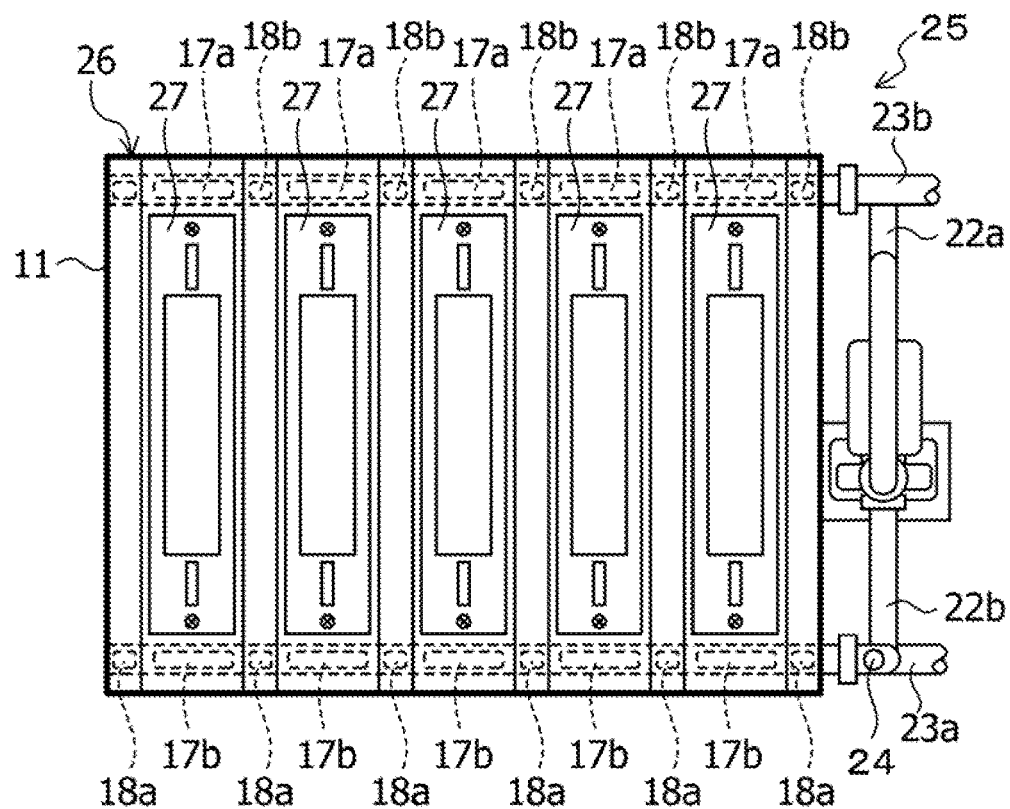
FIG. 2A is a top view of an electronic system.
Figure 2B:
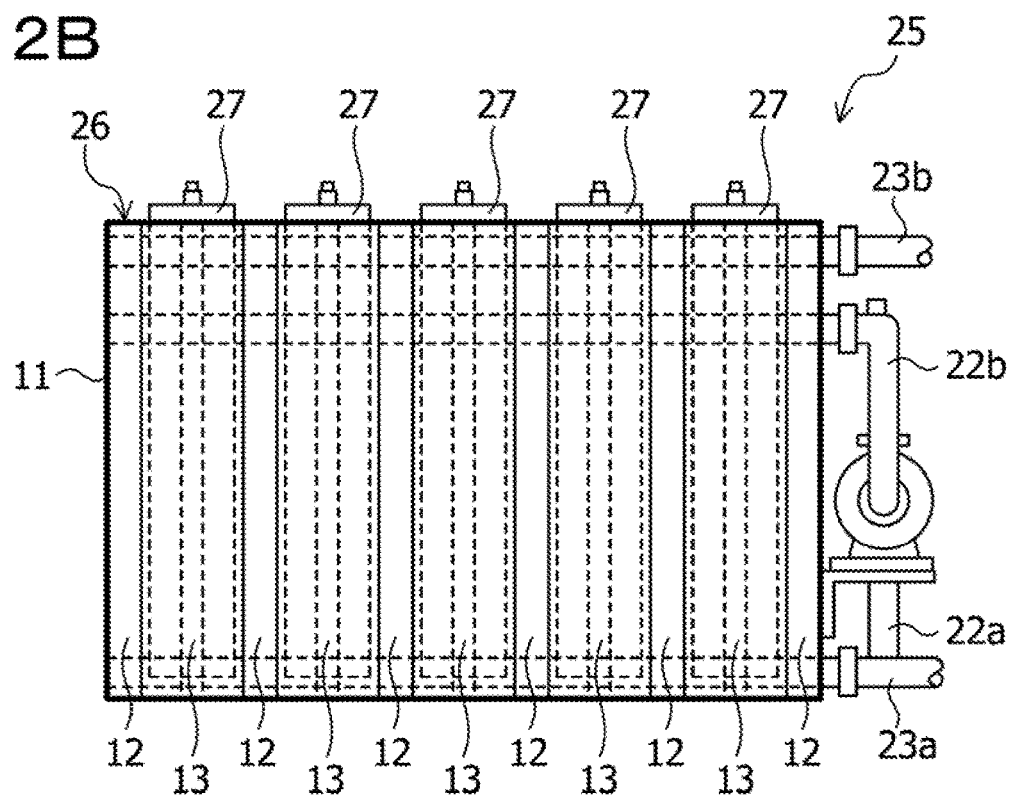
FIG. 2B is a front view of the electronic system.
Figure 3:
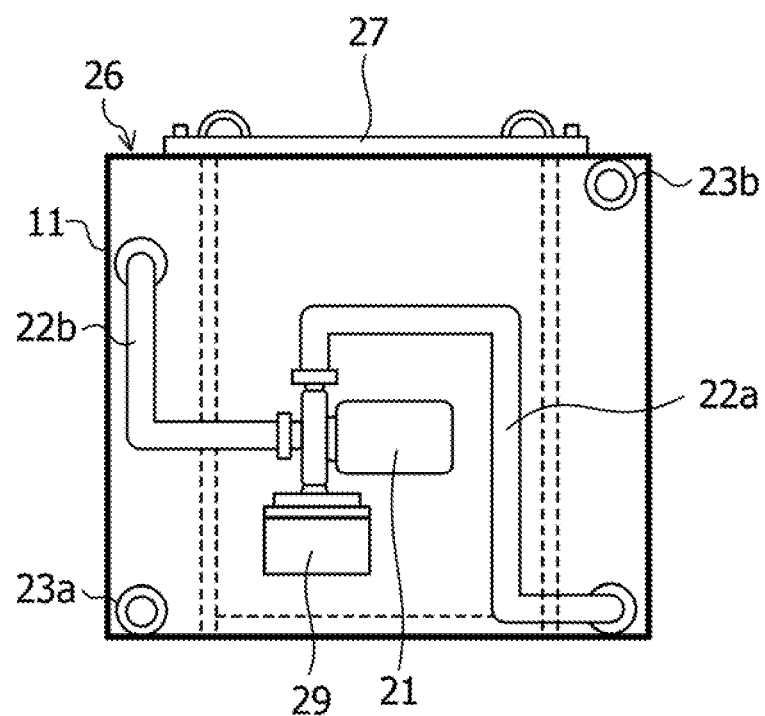
FIG. 3 is a side view of the electronic system.

FIG. 1 is a schematic view illustrating an overview of a cooling system according to a first embodiment. FIG. 2A is a top view of an electronic system, FIG. 2B is a front view of the electronic system, and FIG. 3 is a side view of the electronic system. Further, FIG. 4A is a top view of a cooling device, and FIG. 4B is a front view of the cooling device.

As illustrated in FIG. 1, the cooling system 10 according to the present embodiment includes an electronic system 25 and a waste heat device 30.

Further, as illustrated in FIGS. 2A, 2B and 3, the electronic system 25 includes a cooling device 26, and electronic devices 27 disposed in the cooling device 26.

Figure 4A:
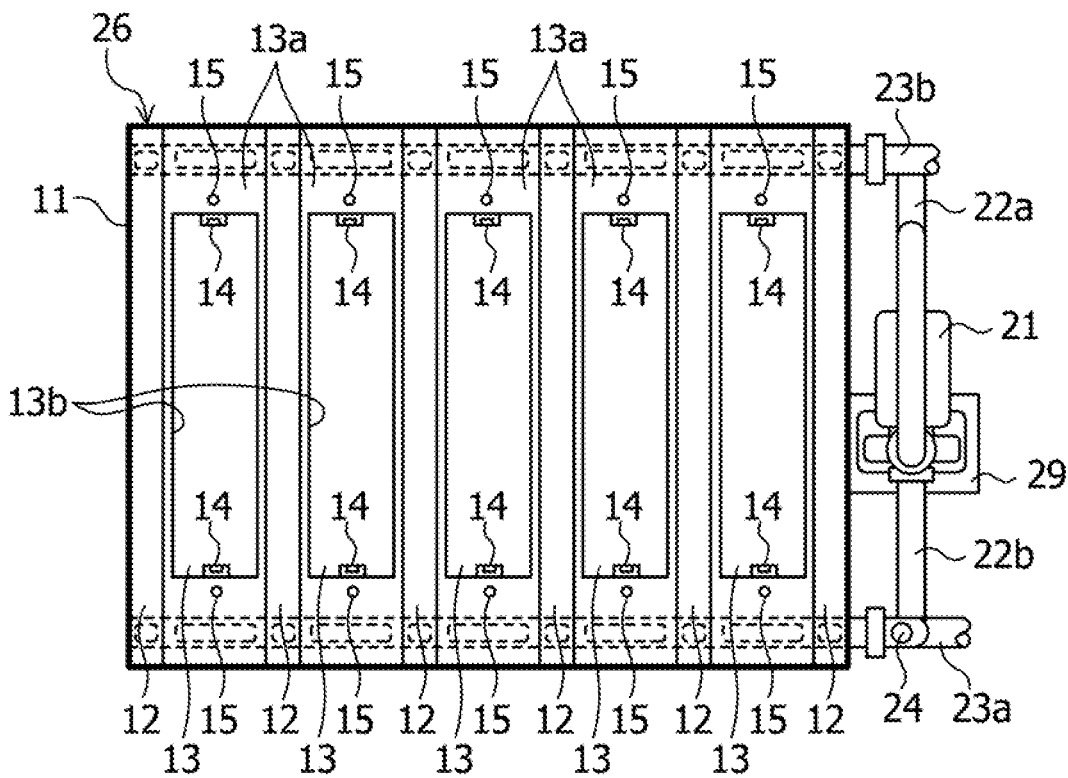
FIG. 4A is a top view of a cooling device.
Figure 4B:
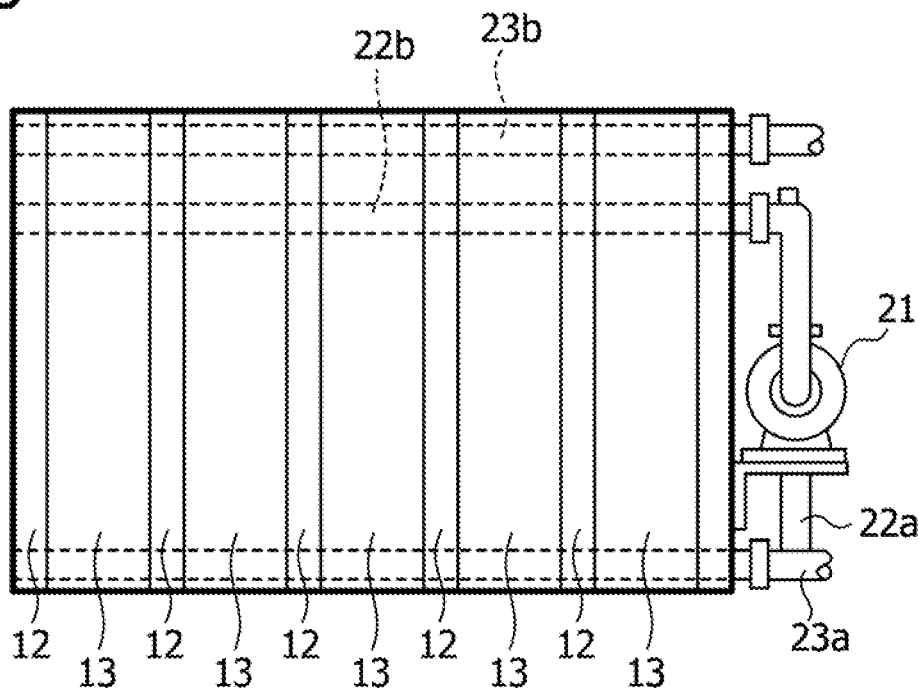
FIG. 4B is a front view of the cooling device.
Figure 5A:
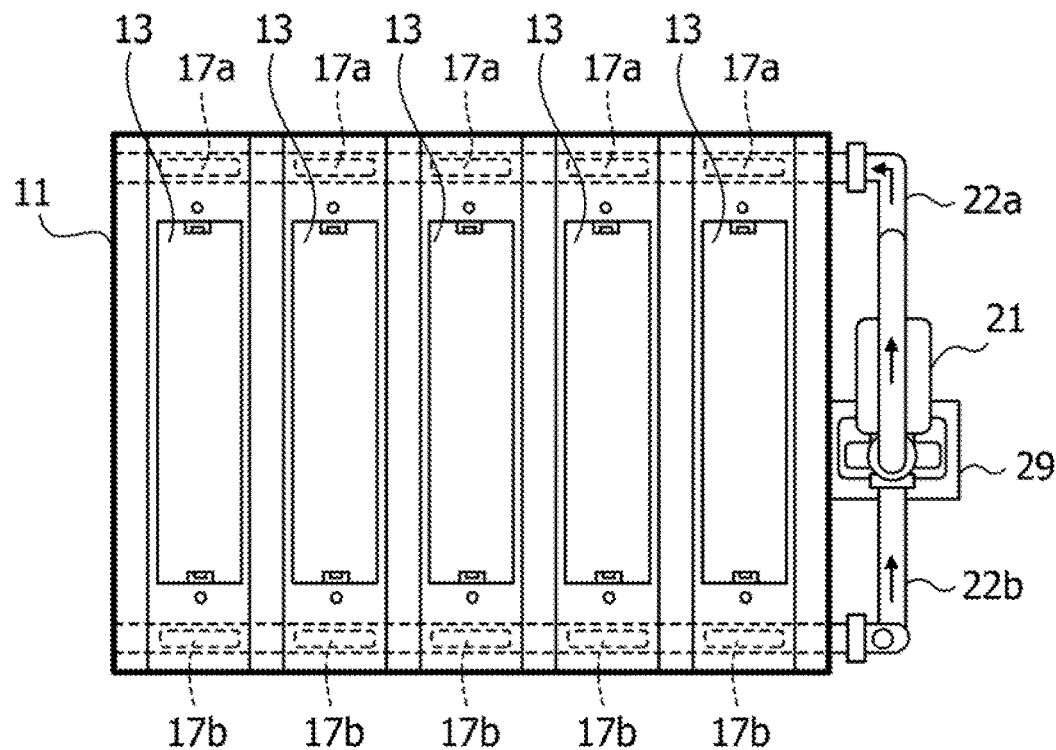
Figure 5B:
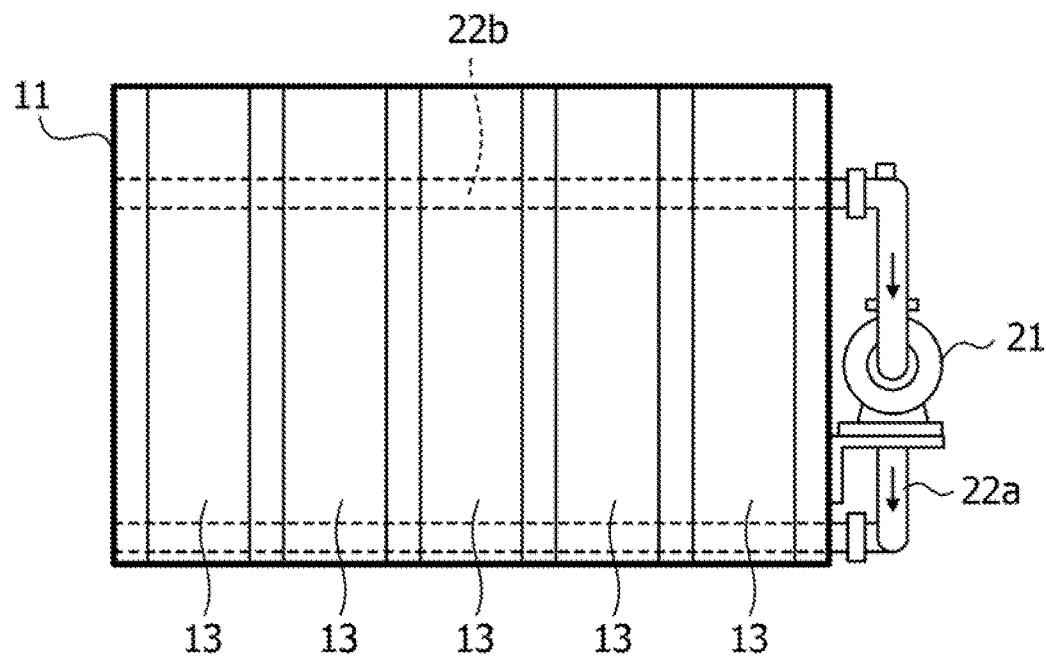
Figure 6A:
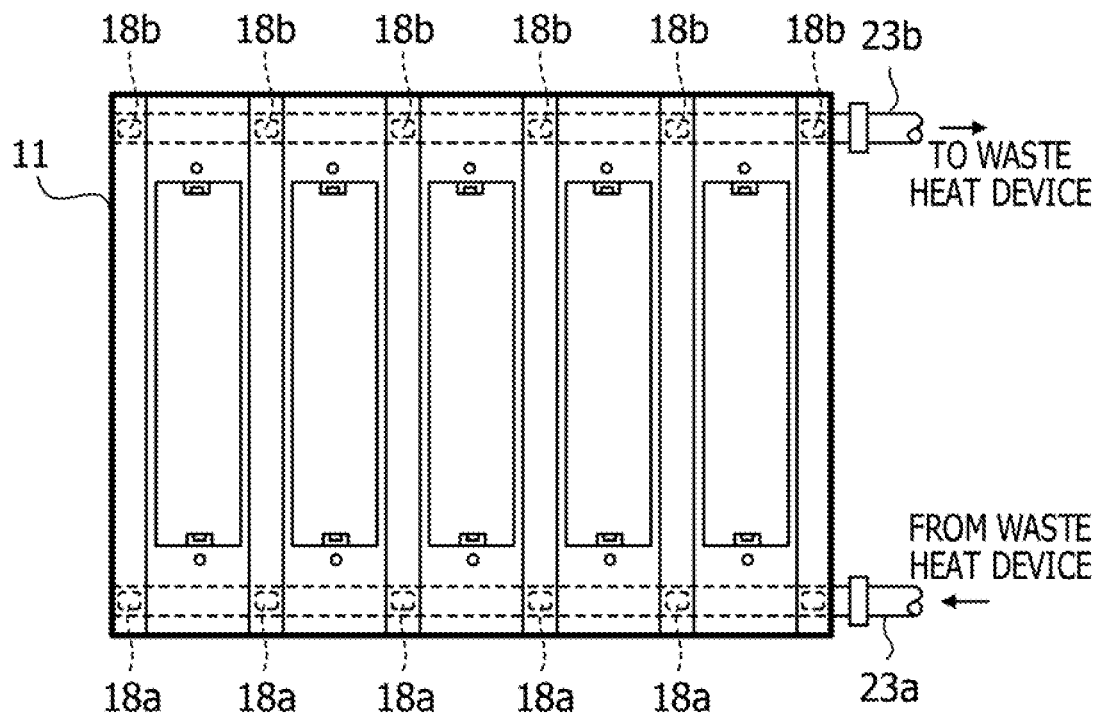
FIGS. 6A and 6B are views obtained by removing a flow path of the inert refrigerant from FIGS. 4A and 48.
Figure 6B:
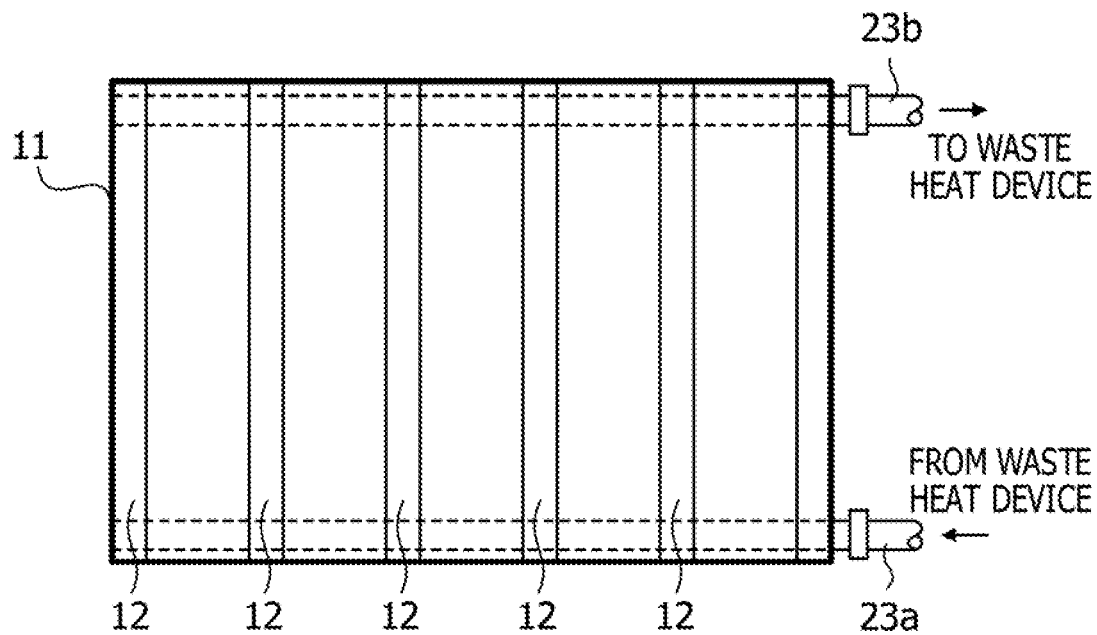

FIGS. 5A and 5B are views obtained by removing a flow path (pipes 23a and 23b) of the cooling water from FIGS. 4A and 4B. FIGS. 6A and 6B are views obtained by removing a flow path (pipes 22a and 22b and a pump 21) of the inert refrigerant from FIGS. 4A and 4B. The configuration of the cooling device 26 will be described with reference to FIGS. 4A and 4B, FIGS. 5A and 5B, and FIGS. 6A and 6B.

As Illustrated in FIGS. 4A and 4B, FIGS. 5A and 5B, and FIGS. 6A and 6B, the cooling device 26 includes a housing 11, a plurality of refrigerant tanks 12 provided in the housing 11, and a plurality of liquid immersion tanks 13 also provided in the housing 11. The refrigerant tanks 12 and the liquid immersion tanks 13 are alternately arranged, and each of the liquid immersion tanks 13 is each sandwiched between corresponding two of the refrigerant tanks 12. One of the two refrigerant tanks 12 sandwiching the liquid immersion tank 13 is a first refrigerant tank, and the other is a second refrigerant tank.

The housing 11 of the cooling device 26 is formed of, for example, a stainless steel plate having a thickness of 5 mm and has a box shape with its top side open. Further, the refrigerant tanks 12 and the liquid immersion tanks 13 are separated from each other by, for example, stainless steel plates having a thickness of 0.5 mm.

In the housing 11 of the cooling device 26, the pipe 22a that supplies an inert refrigerant 16 to the liquid immersion tanks 13, the pipe 22b that collects the inert refrigerant 16 from the liquid immersion tanks 13, the pipe 23a that supplies a cooling water 19 to the refrigerant tanks 12, and the pipe 23b that collects the cooling water 19 from the refrigerant tanks 12 are provided. The pipes 22a and 22b and the pipes 23a and 23b penetrate the housing 11.

The cooling water 19 is an example of a first refrigerant, and the inert refrigerant 16 is an example of a second refrigerant. The pipe 23a is an example of a first sending refrigerant pipe, and the pipe 23b is an example of a first returning refrigerant pipe. Furthermore, the pipe 22a is an example of a second sending refrigerant pipe, and the pipe 22b is an example of a second returning refrigerant pipe.

In the housing 11, the pipe 22a and the pipe 23b are disposed close to one side plate of the housing 11, the pipe 22a is disposed on the lower side, and the pipe 23b is disposed on the upper side. The pipe 22b and the pipe 23a are disposed close to the other side plate opposed to the above-described one side plate, the pipe 22b is disposed on the upper side, and the pipe 23a is disposed on the lower side.

A reference sign 17a in FIGS. 2A and 5A denotes an ejection port of the inert refrigerant 16 formed in the pipe 22a, and a reference sign 17b denotes a suction port of the inert refrigerant 16 formed in the pipe 22b. A reference sign 18a in FIGS. 2A and 6A denotes an ejection port of the cooling water 19 formed in the pipe 23a, and a reference sign 18b denotes a suction port of the cooling water 19 formed in the pipe 23b.

To the outer wall of the housing 11, the pump 21 is attached. A reference sign 29 in FIGS. 3 and 4A denotes a support table for fixing the pump 21 to the housing 11. The delivery of the pump 21 is connected to the pipe 22a, and the suction of the pump 21 is connected to the pipe 22b.

The pump 21 forms a flow of the inert refrigerant 16 flowing through the inside of the pipe 22a, entering into the liquid immersion tanks 13 through the ejection port 17a, flowing through the inside of the liquid immersion tanks 13, flowing into the pipe 22b through the suction port 17b, and flowing back to the pump 21 through the inside of the pipe 22b. The rotation speed (discharge amount) of the pump 21 is controlled by a controller 28 (see FIG. 1).

In the present embodiment, the pump 21 is attached to the outer wall of the liquid immersion tanks 13. Thus, the pipe length between the liquid immersion tanks 13 and the pump 21 is short, and the load applied to the pump 21 is relatively small. Therefore, a small pump can be used as the pump 21, and the increase in equipment cost and installation space may be suppressed.

The pipes 23a and 23b are connected to the waste heat device 30 installed outdoors as illustrated in FIG. 1. The waste heat device 30 has a pump (not illustrated). With this pump, a flow of the cooling water 19 flowing through the pipe 23a, flowing into the refrigerant tanks 12 through the ejection port 18a, flowing inside the refrigerant tanks 12, flowing into the pipe 23b through the suction port 18b, and flowing back to the waste heat device 30 through the pipe 23b is formed.

As the waste heat device 30, for example, a known chiller or a cooling tower can be used. Also, in the present embodiment, an oil such as a fluorine compound (for example, Fluorinert (trademark)), polyalphaolefin (POA) is used as the inert refrigerant 16.

As illustrated in FIG. 1, a flow rate regulating valve 31 is provided on the pipe 23a. The opening of the flow rate regulating valve 31 is controlled according to a signal from the controller 28, and the opening of the flow rate regulating valve 31 determines the flow rate of the cooling water 19 flowing through the pipe 23a. The pipe 22b is provided with a temperature sensor 24 that detects the temperature of the inert refrigerant 16 discharged from the liquid immersion tanks 13. The output of the temperature sensor 24 is transmitted to the controller 28. The flow rate regulating valve 31 is an example of a flow regulating part.

The controller 28 controls the rotation speed of the pump 21 and the opening the flow rate regulating valve 31 in accordance with the output of the temperature sensor 24. The control method of the flow rate regulating valve 31 and the pump 21 by the controller 28 will be described below.

As illustrated in FIGS. 4A and 4B, each of upper plates 13a of the liquid immersion tanks 13 is formed with an opening 13b through which one of the electronic devices 27 is inserted. Further, in each of the liquid immersion tanks 13, a pair of guide rails 14 for guiding both sides of the electronic device 27 when the electronic device 27 is inserted into the liquid immersion tank 13 is provided vertically. Further, the upper plate 13a of the liquid immersion tank 13 is formed with screw holes 15 for fixing the electronic device 27 to the liquid immersion tank 13.

FIG. 7A is a plan view of the electronic device 27, and FIG. 7B is a side view of the electronic device 27.

As illustrated in FIGS. 7A and 7B, the electronic device 27 includes a substrate 41, and CPUs 42, memories 43, storages 44, and a power supply unit (PSU) 45 mounted on the substrate 41. Further, the electronic device 27 is provided with a handle 48, fixing screws 49 screwed in the screw holes 15 to fix the electronic device 27 to the upper plate 13a of the liquid immersion tank 13, and sliding members 47 that slide along the guide rails 14 (see FIG. 4A).

Hereinafter, the operation of the cooling system 10 according to the present embodiment will be described with reference to the schematic view of FIG. 1.

The electronic devices 27 generate heat as they operate. The heat generated by the electronic devices 27 is transferred to the refrigerant tanks 12 via the inert refrigerant 16 in the liquid immersion tanks 13. The heat is transferred to the refrigerant tanks 12 to maintain the temperature of the electronic devices 27 at or below the allowable upper limit temperature.

On the other hand, the heat transferred to the refrigerant tanks 12 via the inert refrigerant 16 is transported to the waste heat device 30 by the cooling water 19 flowing through the refrigerant tanks 12 and dissipated from the waste heat device 30 to the atmosphere. As a result, the temperature of the cooling water 19 flowing through the waste heat device 30 is lowered. The cooling water 19 having a lowered temperature moves from the waste heat device 30 to the refrigerant tanks 12 through the pipe 23a.

Thus, in the present embodiment, the heat generated by the electronic device 27 is transferred to the cooling water 19 in the cooling tanks 12 via the inert refrigerant 16 in the liquid immersion tanks 13 in the housing 11, and is transported to the outdoor waste heat device 30 via the cooling water 19.

In the present embodiment, the electronic devices 27 are immersed in the inert refrigerant 16, and thus even electronic devices generating a large amount of heat may be efficiently cooled.

Further, in the present embodiment, heat is transported by the cooling water 19 from the housing 11 to the waste heat device 30. Therefore, the usage of the inert refrigerant 16 may be small, and the cost for the inert refrigerant 16 may be suppressed.

Furthermore, in the present embodiment, the heat is transferred from the inert refrigerant 16 to the cooling water 19 in the housing 11 of the cooling device 26. Thus, it is not necessary to separately provide a heat exchanger. Thereby, equipment cost may be suppressed.

In the present embodiment, the inert refrigerant 16 is circulated between the pump 21 and the liquid immersion tanks 13 by the pump 21. The reason is as follows.

The fluorine compound, oil, or the like used as the inert refrigerant 16 in the present embodiment generally has a low heat transfer coefficient. Therefore, simply immersing the electronic devices 27 in the inert refrigerant 16 stored in the liquid immersion tanks 13 causes the heat generated by the CPUs 42 (see FIGS. 5A and 5B) to stagnate around the CPUs 42. As a result, the temperature of the CPUs 42 may exceed the allowable upper limit temperature. The pump 21 forcibly generates a flow of the inert refrigerant 16 in the liquid immersion tanks 13 to rapidly transfer the heat generated by the CPUs 42 from the periphery of the CPUs 42, so that the temperature of the CPUs 42 may be maintained at or below the allowable upper limit temperature.

Figure 8:
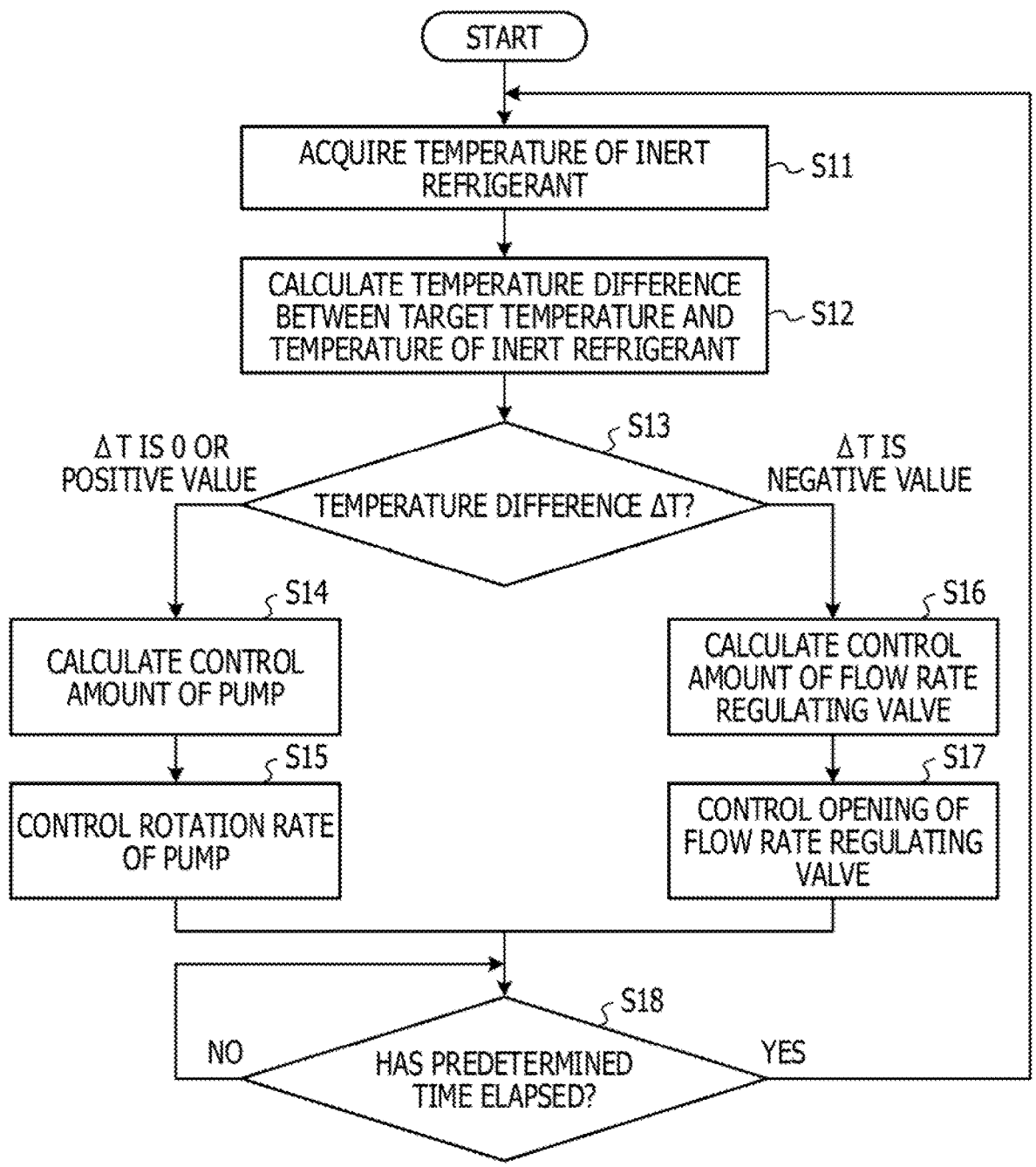
FIG. 8 is a flowchart illustrating a control method of a pump and a flow rate regulating valve by the controller.

Next, control of the pump 21 and the flow rate regulating valve 31 by the controller 28 will be described with reference to the flowchart illustrated in FIG. 8.

First, in step S11, the controller 28 acquires the temperature of the inert refrigerant 16 discharged from the liquid immersion tanks 13 based on the output of the temperature sensor 24. Thereafter, the processing proceeds to step S12 where the controller 28 calculates a temperature difference $\Delta T$ between the temperature of the inert refrigerant 16 and the target temperature (=target temperature−temperature of inert refrigerant 16).

The target temperature is a preset temperature, and can be set to any temperature. However, if the target temperature is too low, the amount of electricity used by the pump 21 and the waste heat device 30 will be large, and if the target temperature is too high, malfunction, failure, or deterioration of processing capability of the electronic devices 27 may be caused. Therefore, it is preferable to set the target temperature to 35° C. or higher and 45° C. or lower. Here, it is assumed that the target temperature is set to 35° C.

After calculating the temperature difference $\Delta T$ in step S12, the processing proceeds to step S13 where the controller 28 determines whether the temperature difference $\Delta T$ is 0 or a positive value, or is a negative value. Here, if the controller 28 determines that the temperature difference $\Delta T$ is 0 or a positive value, the processing proceeds to step S14, and if the controller 28 determines that the temperature difference $\Delta T$ is a negative value, the processing proceeds to step S16.

If the processing proceeds from step S13 to step S14, that is, if the temperature of the inert refrigerant 16 is lower than the target temperature, the controller 28 calculates the control amount (rotation rate) of the pump 21 according to the following expression (1). Note that in the case where the processing proceeds to step S14, the control amount of the flow rate regulating valve 27 is set to be 50%. In addition, in the case were the temperature difference $\Delta T$ is 10° C. or higher, the control amount of the pump 21 is set to be 50%.

$$\text{Control Amount (\%)} = 5 \times (-\Delta T + 10) + 50 \tag{1}$$

For example, if the temperature difference $\Delta T$ is 0° C., the control amount of the pump 21 is calculated to be 100%. When the temperature difference $\Delta T$ is 5° C., the control amount of the pump 21 is calculated to be 75%. Furthermore, if the temperature difference $\Delta T$ is 10° C. or higher, the control amount of the pump 21 is calculated to be 50%.

After the control amount of the pump 21 is calculated as described above in step S14, the processing proceeds to step S15, and the controller 28 controls the pump 21 to have the calculated control amount (rotation rate). Thereafter, the processing proceeds to step S18.

On the other hand, if the processing proceeds from step S13 to step S16, that is, if the temperature of the inert refrigerant 16 is higher than the target temperature, the controller 28 calculates the control amount (opening) of the flow rate regulating valve 27 according to the following expression (2). Note that the control amount of the pump 21 in the case where the processing proceeds to step S16 is set to be 100%. In addition, in the case were the temperature difference ΔT is −10° C. or higher, the control amount of the flow rate regulating valve 27 is set to be 100%.

$$\text{Control Amount (\%)} = (5 \times (-\Delta T)) + 50 \tag{2}$$

For example, if the temperature difference ΔT is 0° C., the control amount of the flow rate regulating valve 27 is calculated to be 50%. In addition, in the case were the temperature difference ΔT is −5° C., the control amount of the flow rate regulating valve 27 is calculated to be 75%. Furthermore, in the case were the temperature difference ΔT is −10° C. or higher, the control amount of the flow rate regulating valve 27 is calculated to be 100%.

After the control amount of the flow rate regulating valve 27 is calculated as described above in step S16, the processing proceeds to step S17, and the controller 28 controls the flow rate regulating valve 27 to have the calculated control amount (opening). Thereafter, the processing proceeds to step S18.

Figure 9:
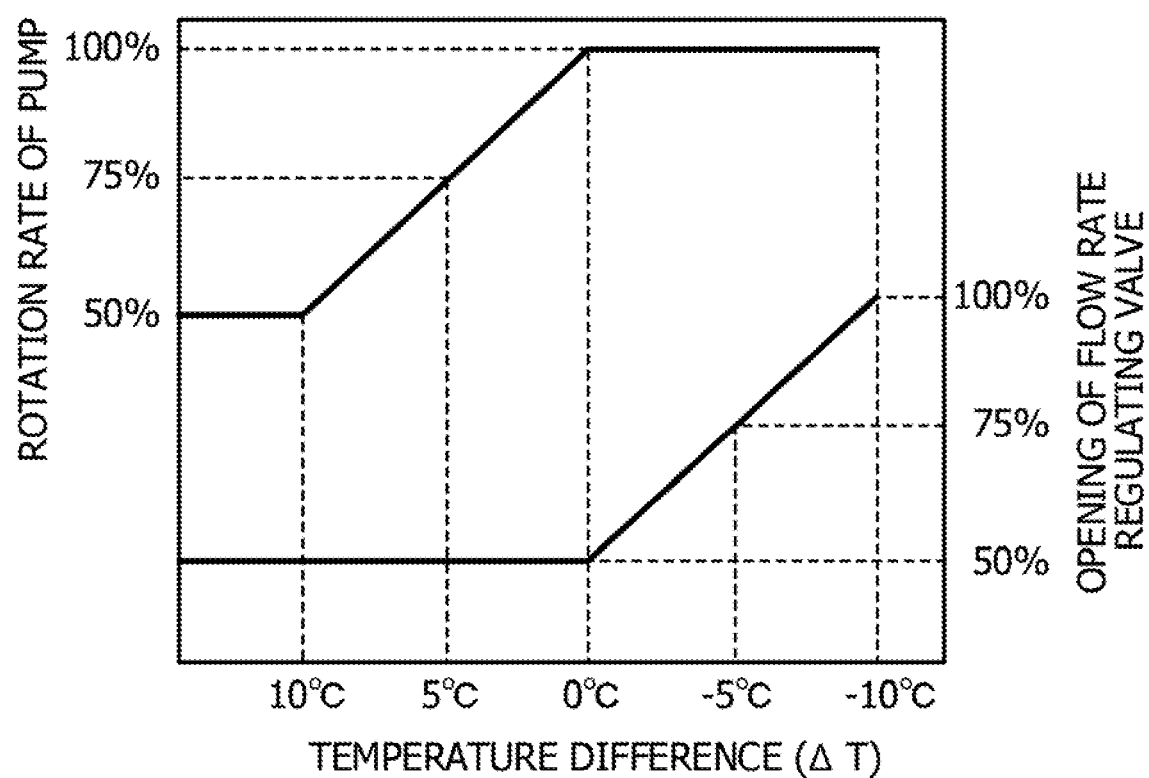
FIG. 9 is a graph illustrating the relationship between the temperature difference ΔT and the control amount (rotation rate) of the pump, and the relationship between the temperature difference ΔT and the control amount (opening) of the flow rate regulating valve together.

FIG. 9 illustrates the relationship between the temperature difference ΔT and the control amount (rotation rate) of the pump 21, and the relationship between the temperature difference ΔT and the control amount (opening) of the flow rate regulating valve 27 together. As illustrated in FIG. 9, when the temperature difference ΔT is 0 or a positive value, the rotation rate of the pump 21 is controlled while setting the opening of the flow rate regulating valve 27 to 50%. When the temperature difference ΔT is a negative value, the opening of the flow rate regulating valve 27 is controlled while setting the rotation rate of the pump 21 to 100%.

When the processing proceeds from step S15 or step S17 to step S18, the controller 28 waits for a predetermined time to elapse. This is because it takes time to stabilize the temperature of the inert refrigerant 16 discharged from the liquid immersion tanks 13 after changing the opening of the flow rate regulating valve 27 or the rotation rate of the pump 21. In the present embodiment, the predetermined time is set to be 10 minutes.

If it is determined in step S18 that the predetermined time has elapsed, the processing returns to step S11, and the respective steps described above are repeated.

As described above, in the present embodiment, the target temperature is set to a relatively high temperature of 35° C. to 45° C. Therefore, the load of the waste heat device 30 becomes relatively low, and the amount of power consumed by the waste heat device 30 may be reduced.

In the present embodiment, the partition plates for partitioning the cooling tanks 12 and the liquid immersion tanks 13 from each other are flat plates, but in order to enhance the heat exchange efficiency between the cooling tanks 12 and the liquid immersion tanks 13, the surfaces of the partition plates may be roughened.

Second Embodiment

Figure 10A:
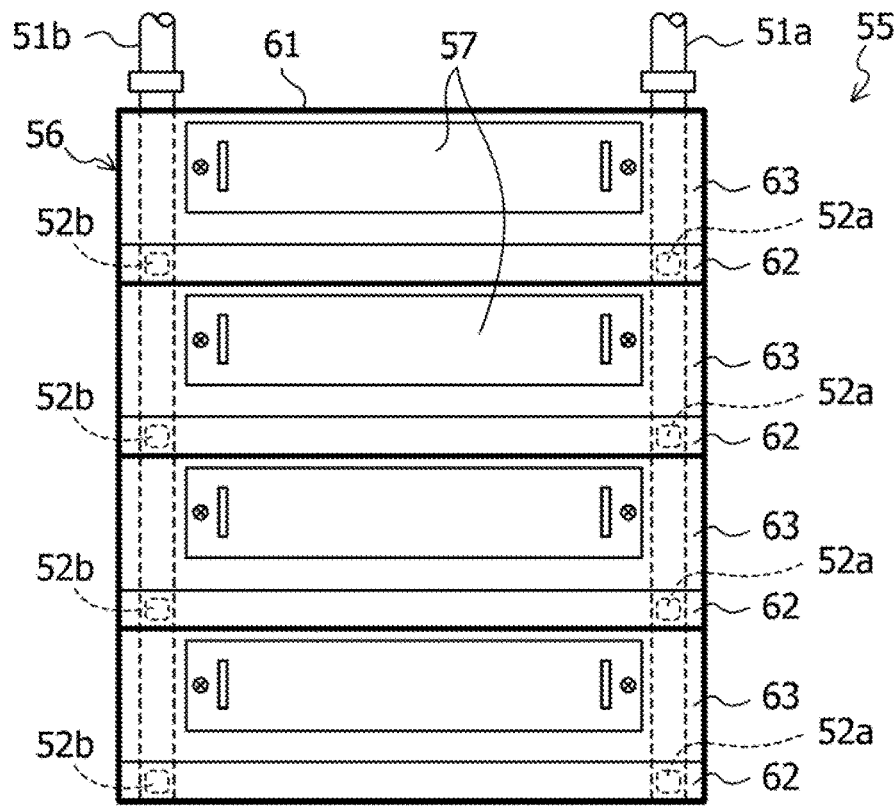
FIG. 10A is a front view of an electronic system according to a second embodiment.
Figure 10B:
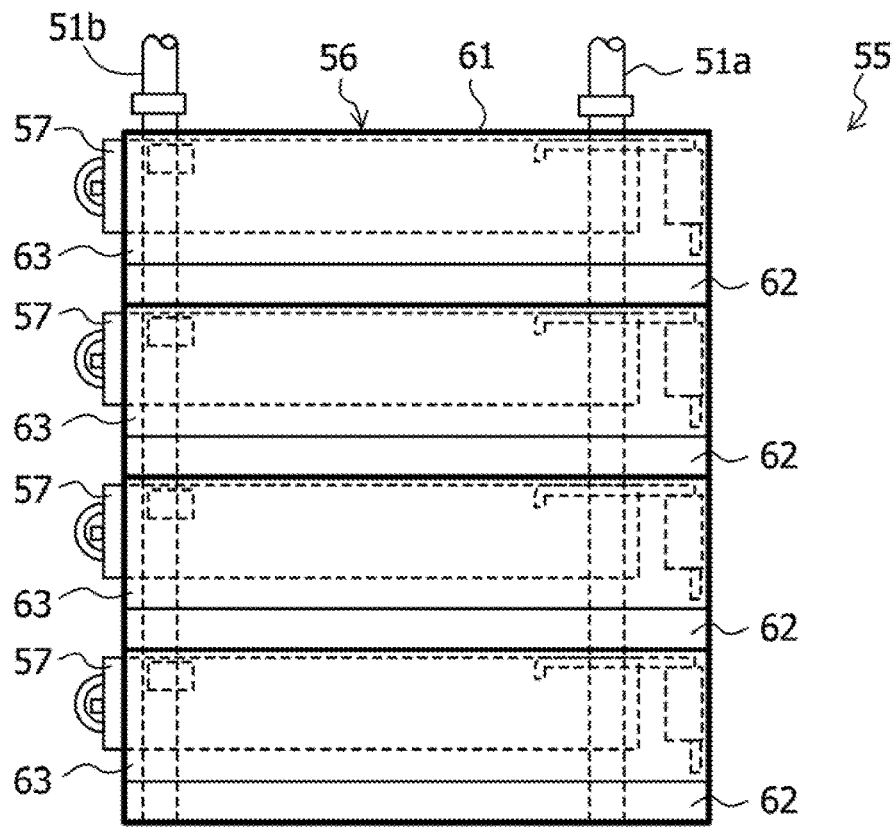
FIG. 10B is a side view of the electronic system.

FIG. 10A is a front view of an electronic system according to a second embodiment, and FIG. 10B is a side view of the electronic system.

As Illustrated in FIGS. 10A and 10B, the electronic system 55 includes a cooling device 56 and an electronic device 57 disposed in the cooling device 56. The cooling device 56 includes a housing 61, a plurality of refrigerant tanks 62 provided in the housing 61, and a plurality of liquid immersion tanks 63 also provided in the housing 61. In the present embodiment, the refrigerant tanks 62 and the liquid immersion tanks 63 are alternately arranged in the height direction.

In the housing 61 of the cooling device 56, a pipe 51a for supplying a cooling water 19 to the cooling tanks 62 and a pipe 51b for collecting the cooling water 19 from the cooling tanks 62 are provided. A reference sign 52a in FIG. 10A denotes an ejection port of the cooling water 19 formed in the pipe 51a, and a reference sign 52b denotes a suction port of the cooling water 19 formed in the pipe 51b. The pipes 51a and 51b are connected to a waste heat device 30 (see FIG. 1) installed outdoors similarly to the first embodiment.

A panel on the front side of each of the liquid immersion tanks 63 is provided with an opening for inserting corresponding one of the electronic devices 57 and a screw (not illustrated) for fixing the electronic device 57 to the liquid immersion tank 63. Further, in the liquid immersion tank 63, a pair of guide rails (not illustrated) for guiding both sides of the electronic device 57 when the electronic device 57 is inserted into the liquid immersion tank 63 is provided horizontally.

Figure 11:
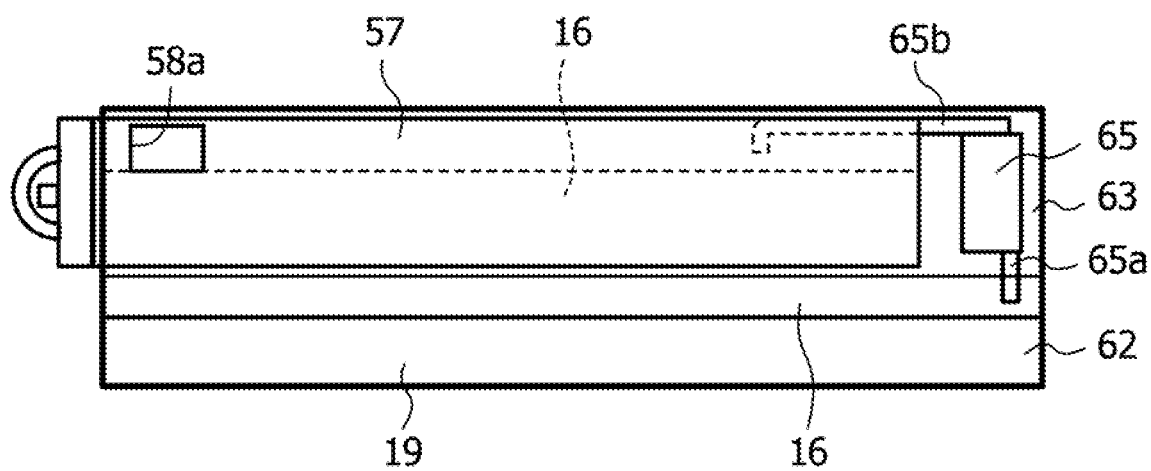
FIG. 11 is an enlarged side view illustrating a pair of cooling tank and liquid immersion tank.

FIG. 11 is an enlarged side view illustrating a pair of cooling tank 62 and liquid immersion tank 63.

In the cooling tank 62, the cooling water 19 flows from the ejection port 52a of the pipe 51a illustrated in FIGS. 10A and 10B to a suction port 52b of the pipe 51b. Above this cooling tank 62, one of the liquid immersion tanks 63 is disposed. The refrigerant tank 62 and the liquid immersion tank 63 are separated from each other by, for example, a stainless steel plate having a thickness of 0.5 mm.

On the back side of the liquid immersion tank 63, a pump 65 is provided. On the lower side of the pump 65, a pipe 65a for suction is provided, and on the upper side of the pump 65, a pipe 65b for discharge is provided. The tip of the discharge pipe 65b extends above the electronic device 57 disposed in the liquid immersion tank 63. The pump 65 sucks the inert refrigerant 16 from the lower side of the liquid immersion tank 63 and discharges the inert refrigerant 16 into the electronic device 57 from the upper side.

Figure 12A:
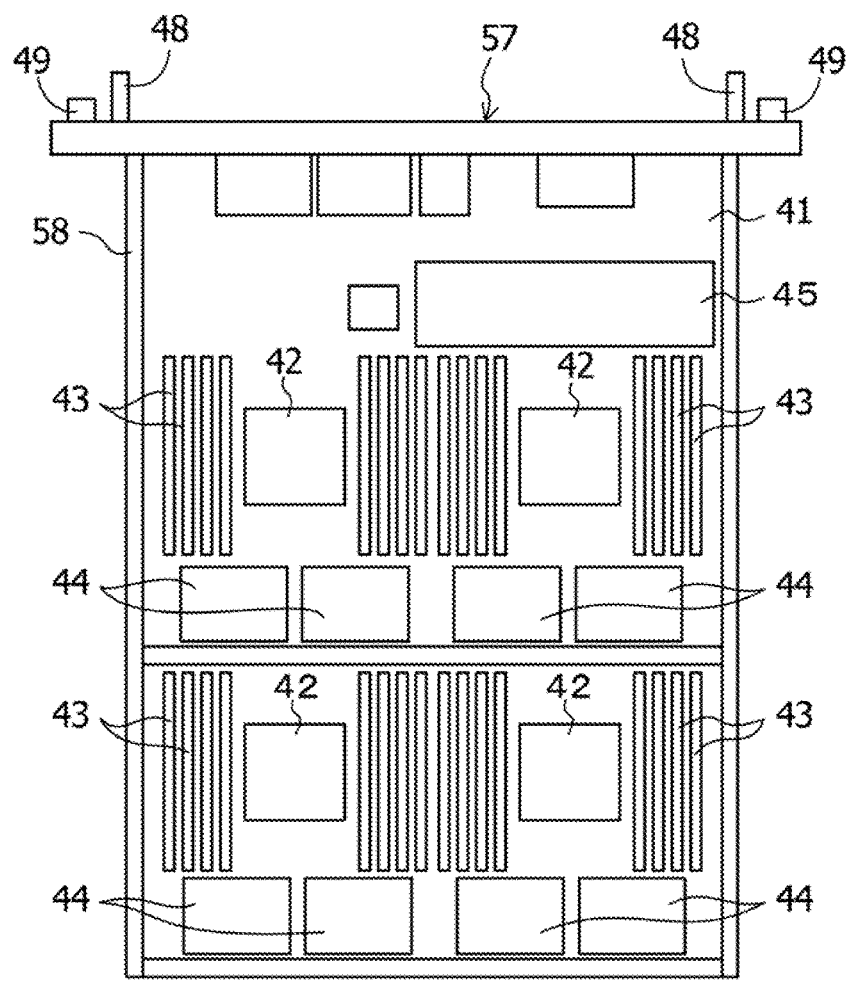
FIG. 12A is a top view of the electronic device.
Figure 12B:
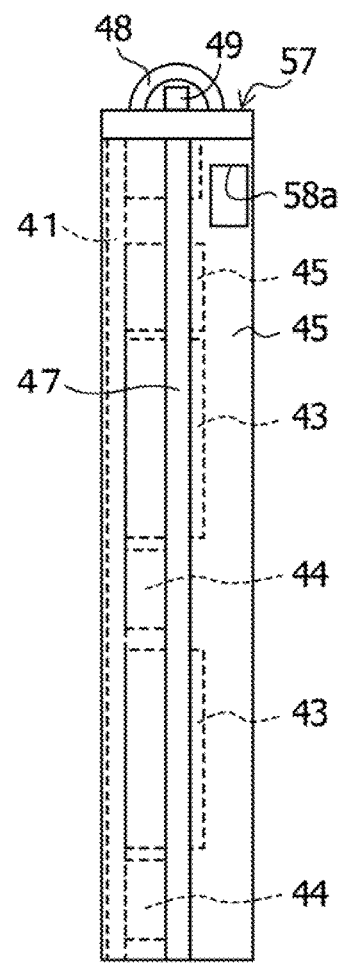
FIG. 12B is a side view of the electronic device.
Figure 12C:
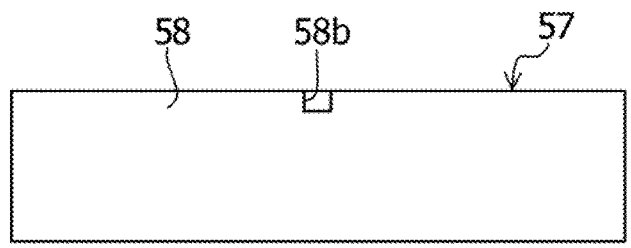
FIG. 12C is a rear view of the electronic device.

FIG. 12A is a top view of the electronic device 57, FIG. 12B is a side view of the electronic device 57, and FIG. 12C is a rear view of the electronic device 57.

The electronic device 57 includes a case 58 having a box shape with its top side open, a substrate 41 disposed in the case 58, and CPUs 42, memories 43, storages 44, and a power supply unit 45 mounted on the substrate 41. Further, the electronic device 57 is provided with a handle 48, fixing screws 49 for fixing the electronic device 57 to the panel of the liquid immersion tank 63, and sliding members 47 that slide along the guide rails. Furthermore, on the side surface of the case 58, an opening 58a through which the inert refrigerant 16 overflows is formed.

The inert refrigerant 16 that overflows through the opening 58a flows into the case 58, thereby making a state where the components including the CPUs 42 (heat generating components) and the like are immersed in the inert refrigerant 16. In the back side of the case 58, a cutout 58b through which the pipe 65b on the delivery side of the pump 65 passes is formed.

Hereinafter, the operation of the cooling system according to the present embodiment will be described.

The inert refrigerant 16 is supplied into the case 58 of the electronic device 57 by the pump 65 disposed in the liquid immersion tank 63. Since the opening 58a is formed on the side surface of the case 58, the inert refrigerant 16 overflows downward through the opening 58a. The inert refrigerant 16 that has overflowed is again sent into the case 58 of the electronic device 57 by the pump 65.

The heat generated by the electronic device 57 is transmitted to the inert refrigerant 16, and transferred to the lower side of the liquid immersion tank 63 with the overflow of the inert refrigerant 16. The heat generated by the electronic device 57 is transferred to the inert refrigerant 16, whereby the temperature of the electronic device 57 is maintained at or below the allowable upper limit temperature.

The heat transferred to the lower side of the liquid immersion tank 63 by the inert refrigerant 16 is further transferred from the liquid immersion tank 63 to the cooling tank 62. Then, the heat is transported to the waste heat device 30 (see FIG. 1) together with the cooling water 19 flowing inside the cooling tank 62 and dissipated from the waste heat device 30 to the atmosphere.

Also in the present embodiment, the heat generating components (such as the CPUs 42) of the electronic device 57 are immersed in the inert refrigerant 16. Thus, even an electronic device generating a large amount of heat can be efficiently cooled.

Further, also in the present embodiment, the heat is transported by the cooling water 19 from the housing 61 to the waste heat device 30. Therefore, the usage of the inert refrigerant 16 may be small, and the cost for the inert refrigerant 16 may be suppressed.

Furthermore, also in the present embodiment, the heat is transferred from the inert refrigerant 16 to the cooling water 19 in the housing 61 of the cooling device 56. Thus, it is not necessary to separately provide a heat exchanger, and thus equipment cost may be suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A cooling system comprising:
a cooling device;
a pump coupled to the cooling device; and
a waste heat device coupled to the cooling device, wherein
the cooling device includes:
a first refrigerant tank and a second refrigerant tank that each stores a first refrigerant that is output from the waste heat device and input to the waste heat device; and
a liquid immersion tank sandwiched between the first refrigerant tank and the second refrigerant tank and configured to hold an electronic device in a second refrigerant that is output from the pump and input to the pump.

2. The cooling system according to claim 1, wherein
a first sending refrigerant pipe that sends the first refrigerant flowing from the second refrigerant tank to the first refrigerant tank and a first returning refrigerant pipe that returns the first refrigerant which flows from the first refrigerant tank to the second refrigerant tank penetrate the liquid immersion tank.

3. The cooling system according to claim 1, wherein
a second sending refrigerant pipe that sends the second refrigerant which flows to the liquid immersion tank and a second returning refrigerant pipe that returns the second refrigerant which flows to the liquid immersion tank penetrate the second refrigerant tank.

4. The cooling system according to claim 1, further comprising:
a temperature sensor configured to detect a temperature of the second refrigerant which flows from the liquid immersion tank to the pump;
a flow regulator configured to regulate a flow rate of the first refrigerant output from the waste heat device; and
a controller configured to control the pump and the flow regulator based on an output of the temperature sensor.

5. The cooling system according to claim 1, wherein the pump is disposed in the liquid immersion tank.

6. A cooling device comprising:
a first refrigerant tank and a second refrigerant tank configured to each store a first refrigerant that is output from a waste heat device coupled to the cooling device and input to the waste heat device, and
a liquid immersion tank sandwiched between the first refrigerant tank and the second refrigerant tank and configured to hold an electronic device in a second refrigerant that is output from the pump and input to the pump.

7. The cooling device according to claim 6, wherein the pump is disposed in the liquid immersion tank.

8. An electronic system comprising:
an electronic device that generates heat;
a first refrigerant tank and a second refrigerant tank that each store a first refrigerant that is output from a waste heat device and input to the waste heat device, and
a liquid immersion tank that is sandwiched between the first refrigerant tank and the second refrigerant tank and that holds the electronic device in a second refrigerant output from the pump and input to the pump.

9. The electronic system according to claim 8, wherein the pump is disposed in the liquid immersion tank.

* * * * *